United States Patent
Chou et al.

(10) Patent No.: US 10,868,058 B2
(45) Date of Patent: *Dec. 15, 2020

(54) PHOTODIODE GATE DIELECTRIC PROTECTION LAYER

(71) Applicant: Taiwan Semiconductor Manufacturing Co., Ltd., Hsin-Chu (TW)

(72) Inventors: Cheng-Hsien Chou, Tainan (TW); Wen-I Hsu, Tainan (TW); Tsun-Kai Tsao, Tainan (TW); Chih-Yu Lai, Tainan (TW); Jiech-Fun Lu, Madou Township (TW); Yeur-Luen Tu, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/218,806

(22) Filed: Dec. 13, 2018

(65) Prior Publication Data

US 2019/0115382 A1 Apr. 18, 2019

Related U.S. Application Data

(60) Continuation of application No. 15/803,995, filed on Nov. 6, 2017, now Pat. No. 10,163,947, which is a
(Continued)

(51) Int. Cl.
*H01L 27/146* (2006.01)
*H01L 31/18* (2006.01)

(52) U.S. Cl.
CPC .. *H01L 27/14614* (2013.01); *H01L 27/14636* (2013.01); *H01L 27/14643* (2013.01); *H01L 27/14689* (2013.01); *H01L 31/18* (2013.01)

(58) Field of Classification Search
None
See application file for complete search history.

(56) References Cited

U.S. PATENT DOCUMENTS 5,877,054 A * 3/1999 Yamauchi .......... G11C 16/0491
257/E21.682
7,119,322 B2 10/2006 Hong
(Continued)

FOREIGN PATENT DOCUMENTS

CN 101197388 A 6/2008
WO 2009149221 A1 12/2009

OTHER PUBLICATIONS

Non-Final Office Action dated Feb. 10, 2015 for U.S. Appl. No. 13/948,217.
(Continued)

*Primary Examiner* — Thien F Tran
(74) *Attorney, Agent, or Firm* — Eschweiler & Potashnik, LLC

(57) ABSTRACT

The present disclosure, in some embodiments, relates to a method of forming an integrated chip. The method is performed by forming a gate dielectric layer over a substrate having a first photodetector region and forming a gate material over the gate dielectric layer. A dielectric protection layer is deposited over the gate dielectric layer and a first sidewall spacer is formed along a side of the gate material. The dielectric protection layer extends from a first location directly over the first photodetector region to a second location between the first sidewall spacer and the gate dielectric layer.

20 Claims, 7 Drawing Sheets

Related U.S. Application Data division of application No. 15/169,994, filed on Jun. 1, 2016, now Pat. No. 9,812,477, which is a continuation of application No. 14/867,070, filed on Sep. 28, 2015, now Pat. No. 9,412,781, which is a continuation of application No. 13/948,217, filed on Jul. 23, 2013, now Pat. No. 9,147,710.

(56) References Cited

U.S. PATENT DOCUMENTS

| | | |
|---|---|---|
| 9,000,491 B2 | 4/2015 | Loubet et al. |
| 10,163,947 B2 * | 12/2018 | Chou ............... H01L 27/14643 |
| 2004/0121566 A1 | 6/2004 | Laibowitz et al. |
| 2006/0038248 A1 | 2/2006 | Lee |
| 2006/0086955 A1 | 4/2006 | Iwata |
| 2007/0148811 A1 | 6/2007 | Han |
| 2007/0241372 A1 | 10/2007 | Kao |
| 2008/0142856 A1 | 6/2008 | Sato et al. |
| 2008/0160660 A1 | 7/2008 | Shim |
| 2008/0182371 A1 | 7/2008 | Gehring et al. |
| 2009/0303366 A1 | 12/2009 | Gambino et al. |
| 2010/0123174 A1 | 5/2010 | Mao et al. |
| 2012/0080733 A1 | 4/2012 | Doan et al. |
| 2016/0020243 A1 | 1/2016 | Chou et al. |

OTHER PUBLICATIONS

Notice of Allowance dated May 27, 2015 for U.S. Appl. No. 13/948,217.

Notice of Allowance dated Mar. 30, 2016 for U.S. Appl. No. 14/867,070.

Non-Final Office Action dated Mar. 9, 2017 for U.S. Appl. No. 15/169,994.

Notice of Allowance dated Jul. 5, 2017 for U.S. Appl. No. 15/169,994.

Non-Final Office Action dated Mar. 27, 2018 for U.S. Appl. No. 15/803,995.

Notice of Allowance dated Aug. 27, 2018 for U.S. Appl. No. 15/803,995.

* cited by examiner

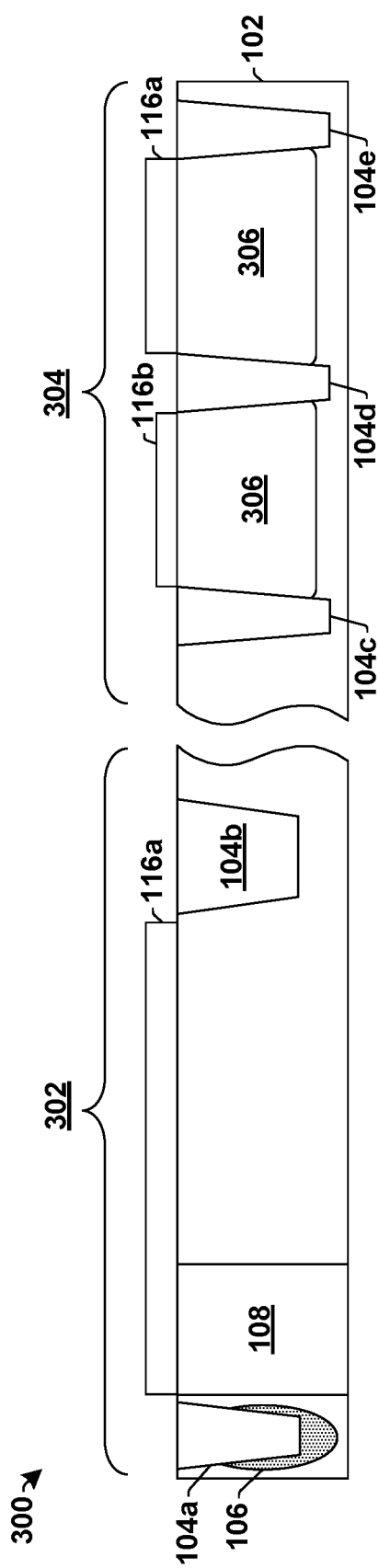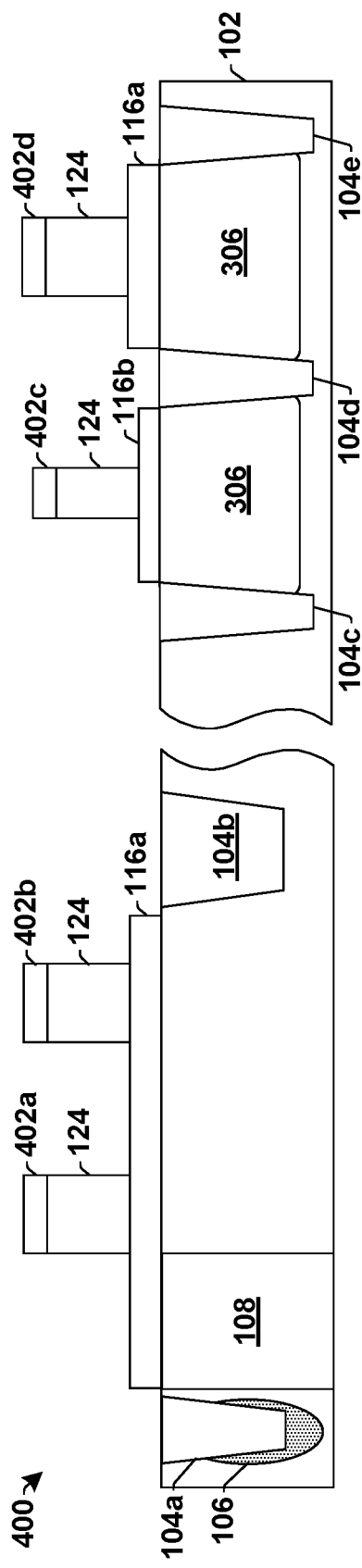

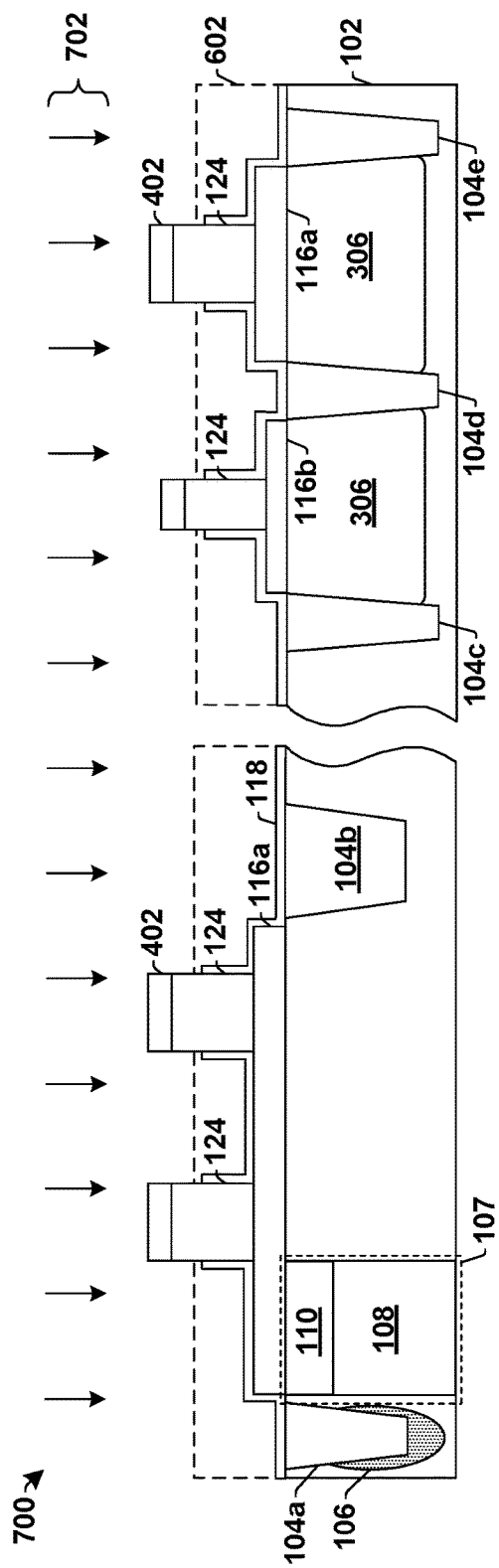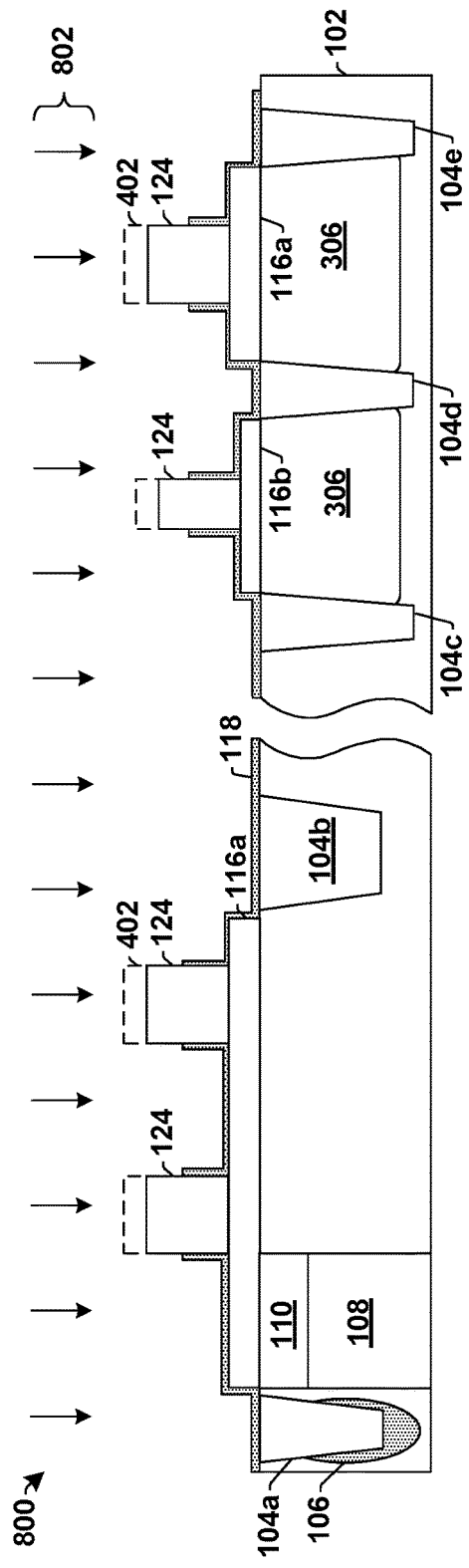

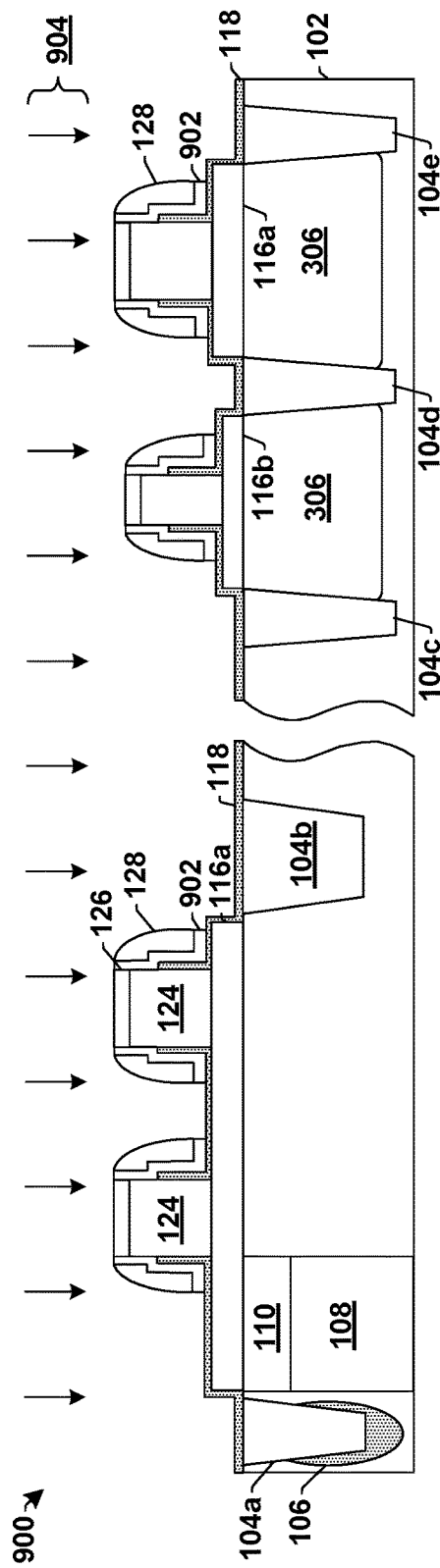
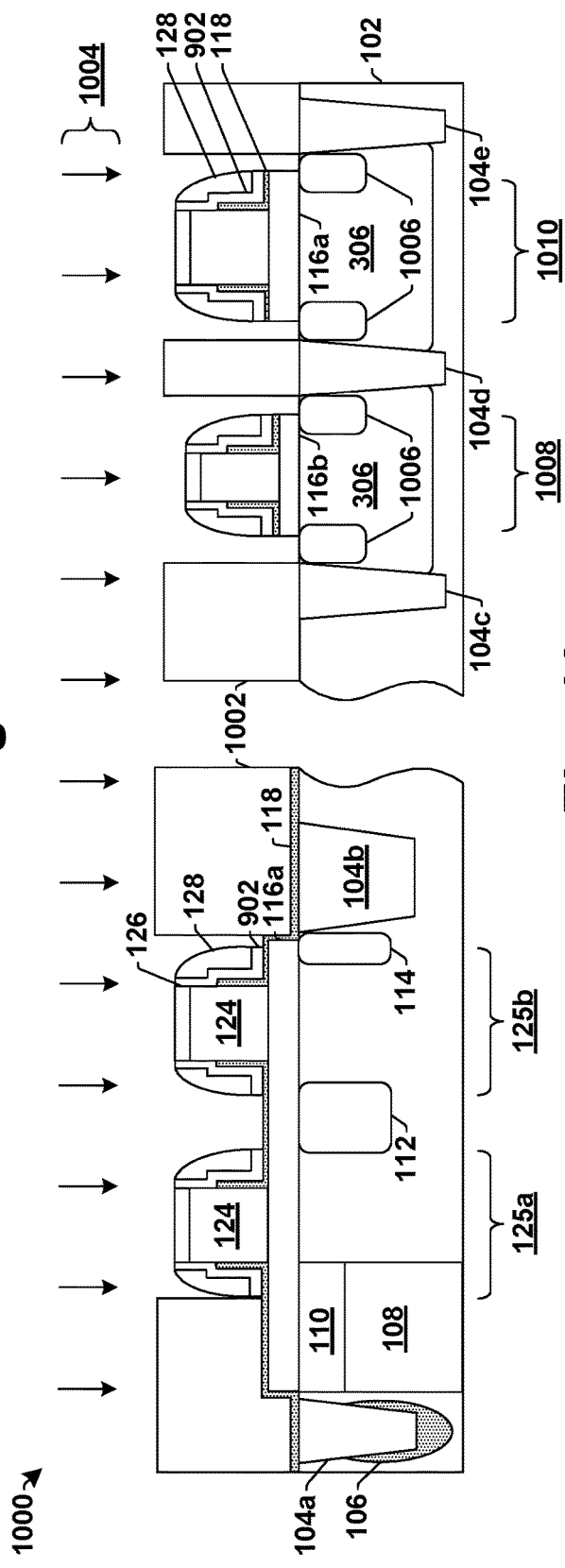

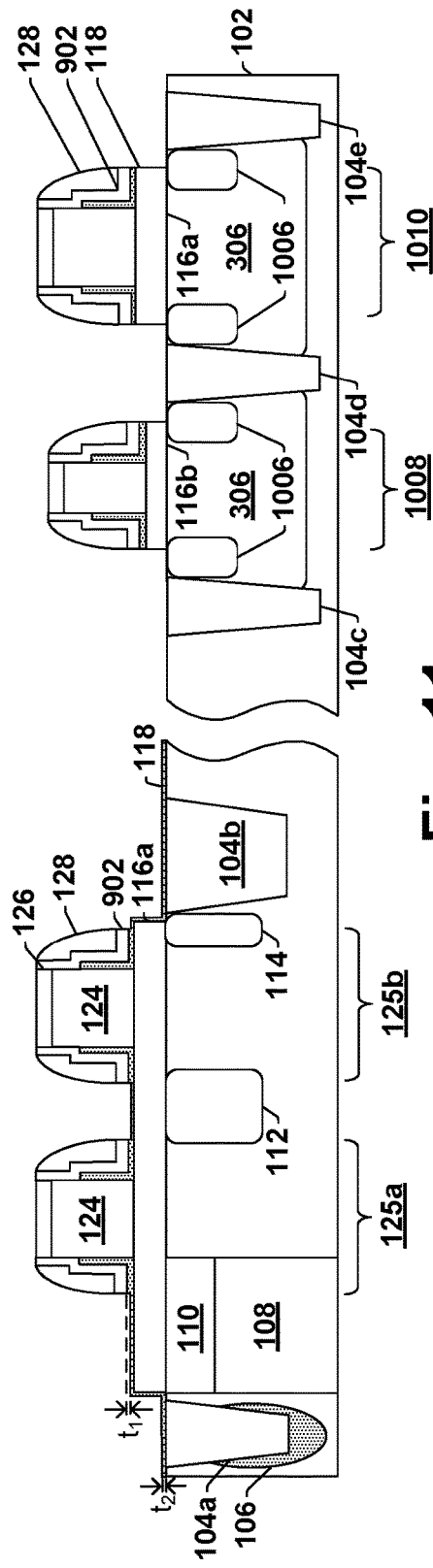
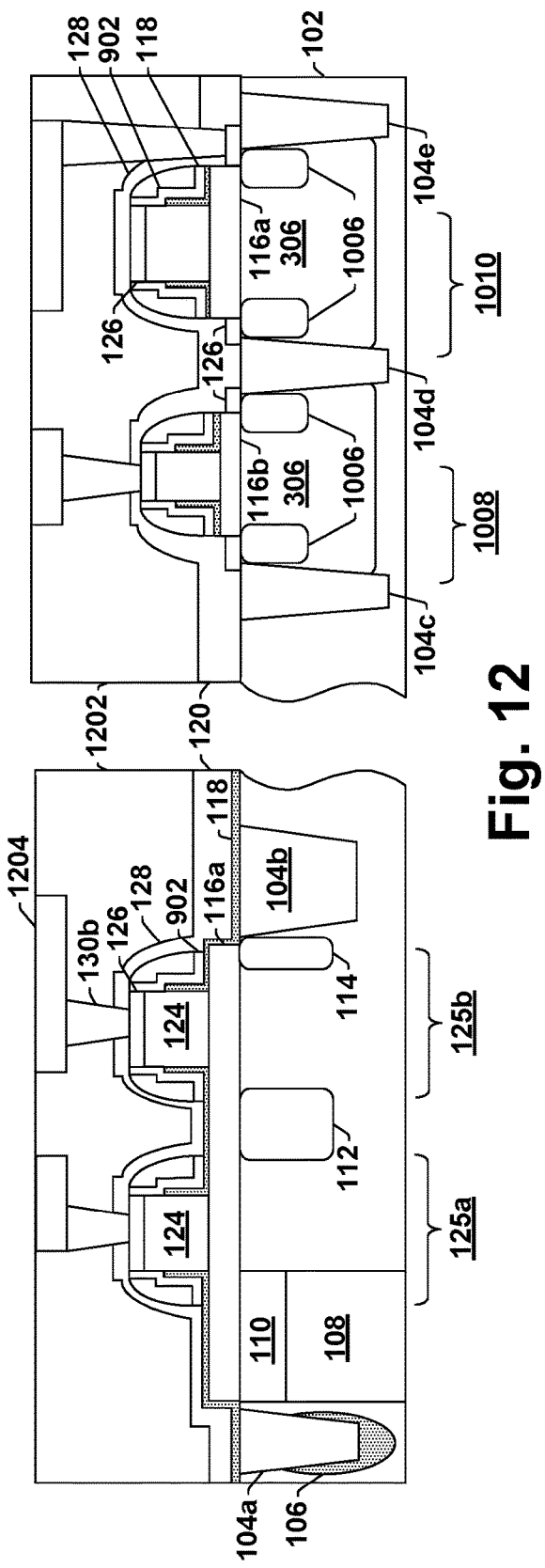
Fig. 11
Fig. 12

PHOTODIODE GATE DIELECTRIC PROTECTION LAYER

REFERENCE TO RELATED APPLICATIONS

This Application is a Continuation of U.S. application Ser. No. 15/803,995, filed on Nov. 6, 2017, which is a Divisional of U.S. application Ser. No. 15/169,994, filed on Jun. 1, 2016 (now U.S. Pat. No. 9,812,477, issued on Nov. 7, 2017), which is a continuation of U.S. application Ser. No. 14/867, 070, filed on Sep. 28, 2015 (now U.S. Pat. No. 9,412,781, issued on Aug. 9, 2016), which is a continuation of U.S. application Ser. No. 13/948,217, filed on Jul. 23, 2013 (now U.S. Pat. No. 9,147,710, issued on Sep. 29, 2015). The contents of the above-referenced patent applications are hereby incorporated by reference in their entirety.

BACKGROUND

Photodiodes are widely used in many modern day electronic devices to convert light into an electric signal (e.g., a voltage or a current). A photodiode is a p-n junction (i.e., an interface between a p-type region and an n-type region) or PIN structure within a semiconductor substrate. Photodiodes are typically formed within an exposed surface of a semiconductor substrate to allow the photodiode to receive light.

During operation, when a photon of sufficient energy strikes a photodiode it excites an electron within a semiconductor substrate of the photodiode, thereby generating an electron-hole pair. As electrons and holes are generated, the holes move in the semiconductor substrate in an opposite direction as the electrons to generate a current.

BRIEF DESCRIPTION OF THE DRAWINGS

FIGS. 3-12 illustrate some embodiments of a semiconductor substrate upon which method of forming an active pixel sensor is enacted, according to the method of FIG. 2.

DETAILED DESCRIPTION

Figure 1A:
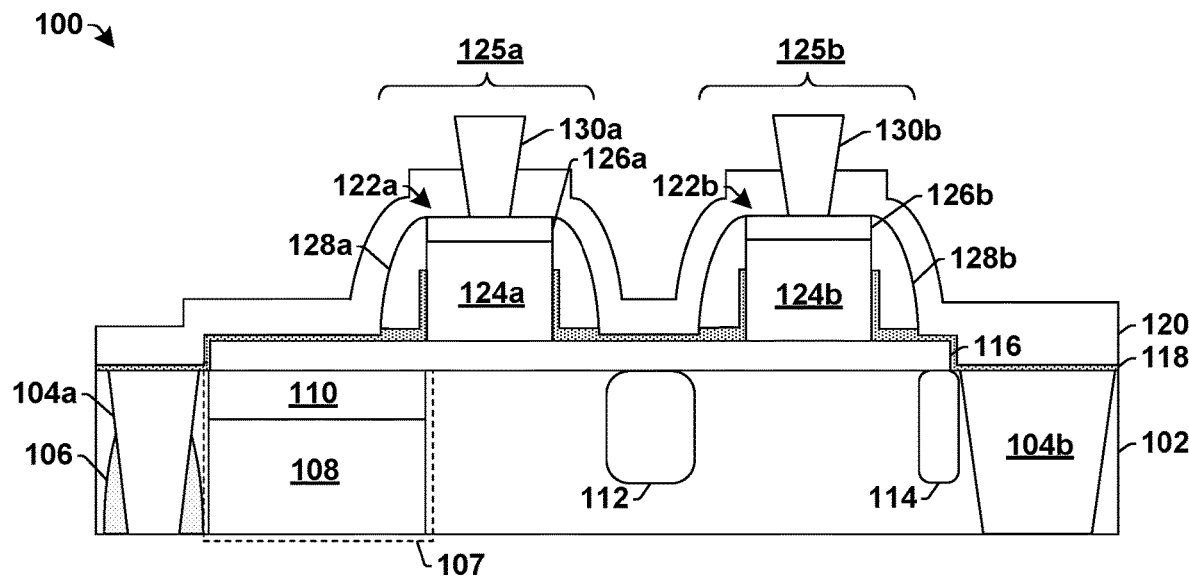
FIGS. 1A-1B illustrate cross-sectional views of some embodiments of a active pixel sensor comprising a gate dielectric protection layer.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

Active pixel sensors comprise a semiconductor substrate having a photodetector connected to multiple transistor devices. During fabrication of the transistor devices the semiconductor substrate undergoes numerous etching processes. The etching processes can damage the gate dielectric material of the transistor devices and the underlying semiconductor substrate. For example, during fabrication of a gate structure, polysilicon may be selectively etched using a dry etching process that can cause a loss of gate dielectric material and/or that can damage the underlying semiconductor substrate. Similar damage to the gate dielectric material and/or underlying semiconductor substrate can occur during hard mask removal, sidewall spacer etching, and photoresist ashing process, for example.

The removal of gate dielectric material results in a thinner gate dielectric material outside of the transistor device, adversely affecting the number white pixels and/or the dark current of the active pixel sensor. For example, overetching during the formation of sidewall spacers can cause the number white pixels of an active pixel sensor to decrease. To prevent such an adversely effect in white pixels and/or the dark current of the active pixel sensor, a thicker gate dielectric material can be used, however the thicker gate dielectric material will increase the read noise, the random telegraph signal, and/or the power consumption of the active pixel sensor.

Accordingly, the present disclosure relates to an active pixel sensor having a gate dielectric protection layer configured to reduce damage to an underlying gate dielectric layer and/or semiconductor substrate during fabrication, and an associated method of formation. In some embodiments, the active pixel sensor comprises a photodetector disposed within a semiconductor substrate. A transfer transistor comprising a first gate structure is located on a first gate dielectric layer disposed above the semiconductor substrate. A reset transistor comprising a second gate structure is located on the first gate dielectric layer. A gate dielectric protection layer is disposed onto the gate dielectric at a position extending between the first gate structure and the second gate structure and over the photodetector. The gate dielectric protection layer is configured to protect the gate dielectric from etching procedures during fabrication of the active pixel sensor.

Figure 1B:
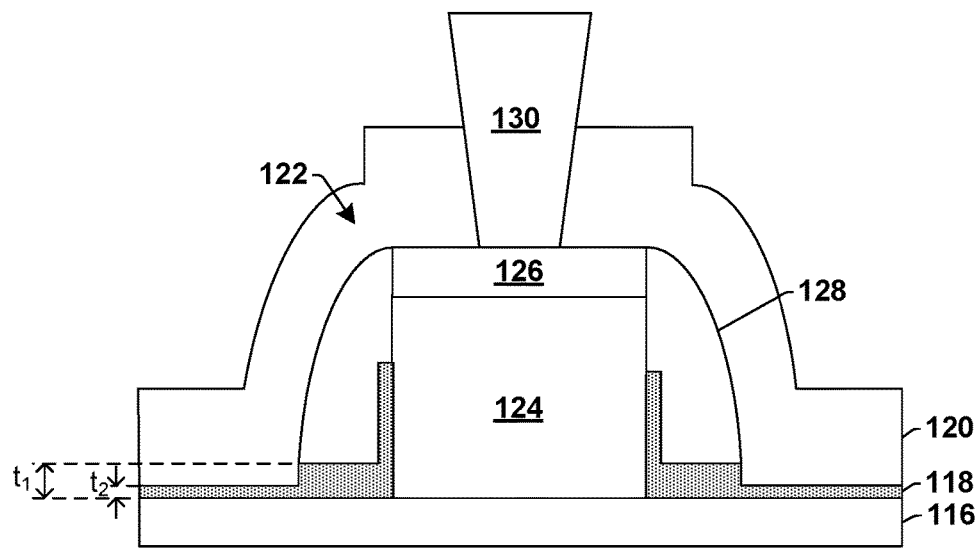

FIGS. 1A-1B illustrate cross-sectional views corresponding to some embodiments of an active pixel sensor 100 comprising a gate dielectric protection layer 118.

As shown in FIG. 1A, the active pixel sensor (APS) 100 comprises a photodetector 107 disposed within a semiconductor substrate 102. In some embodiments, the photodetector 107 may comprise a pinned photodiode. The photodetector 107 has a first doped region 108 and a second doped region 110 disposed within the semiconductor substrate 102. In some embodiments, the first doped region 108 may have a first doping type (e.g., a p-type doping), the second doped region 110 may have a second doping type different than the first doping type (e.g., an n-type doping), and the semiconductor substrate 102 may have the first doping type (e.g., the p-type doping).

Isolation regions 104 are disposed along a perimeter of the APS 100 to provide isolation of the APS 100 from adjacent active pixel sensors. In some embodiments, the isolation regions 104 may comprise shallow trench isolation regions. In additional embodiments, an isolation implantation 106 may be disposed around the isolation regions 104. A gate dielectric layer 116 is disposed over the semiconductor substrate 102 at a position between the isolation regions 104. In some embodiments, the gate dielectric layer 116 may comprise a silicon dioxide ($SiO_2$) layer. The gate dielectric layer 116 may have a thickness that is less than or equal to approximately 50 angstroms.

A first gate structure 122a and a second gate structure 122b are disposed over the gate dielectric layer 116. The first gate structure 122a comprises a stack having a gate material 124a and a silicide layer 126a flanked by a first sidewall spacer 128a. The second gate structure 122b comprises a stack having a gate material 124b and a silicide layer 126b flanked by a second sidewall spacer 128b. In some embodiments, the sidewall spacers, 128a and 128b, may comprise nitride spacers. The first gate structure 122a is comprised within a transfer transistor 125a. The second gate structure 122b is comprised within a reset transistor 125b. Gate contacts 130a and 130b, configured to connect the transfer transistor 125a and the reset transistor 125b to one or more metal interconnect layers, are located above silicide layers 126a and 126b, respectively.

During operation, photons striking the surface of the photodetector 107 generate electrons which are collected in the first doped region 108. When the transfer transistor 125a is turned on, the photon-generated electrons in the first doped region 108 are transferred to the floating diffusion region 112 as a result of a potential difference existing between the photodetector 107 and floating diffusion region 112 (which is further connected to the gate of a read-out transistor that is not shown). The charges are converted to voltage signals by a source follower transistor (not shown). Prior to charge transfer, the floating diffusion region 112 is set to a predetermined low charge state by turning on the reset transistor 125b, which causes electrons in the floating diffusion region 112 to flow into a voltage source connected to a source/drain region 114.

A gate dielectric protection layer 118 is disposed over the semiconductor substrate 102 at a position that overlies the gate dielectric layer 116. The gate dielectric protection layer 118 extends between the first gate structure 122a and the second gate structure 122b without overlying a top of the first gate structure 122a or the second gate structure 122b. In some embodiments, the gate dielectric protection layer 118 extends from a first position between a first sidewall spacer 128a flanking the first gate structure 122a and the first gate dielectric layer 116a to a second position between a second sidewall spacer 128b flanking the second gate structure 122b and the first gate dielectric layer 116a. The gate dielectric protection layer 118 also extends to a position that overlies the photodetector 107. In some embodiments, the gate dielectric protection layer 118 is further disposed below a contact etch stop layer (CESL) 120.

In some embodiments, the gate dielectric protection layer 118 is disposed as a conformal thin film that abuts the isolation regions 104, the gate dielectric layer 116, and the gate material 124. In some embodiments, the gate dielectric protection layer 118 may extend along at least a lower portion of sidewalls of the gate material 124. In various embodiments, the gate dielectric protection layer 118 may comprise an oxide layer (e.g., $SiO_2$), a silicon nitride layer (SiN), or a high-k dielectric material (e.g., hafnium oxide ($HfO_2$), aluminum oxide ($Al_2O_3$), titanium oxide ($TiO_2$), HfZrO, $Ta_2O_3$, $HfSiO_4$, $ZrO_2$, $ZrSiO_2$, etc).

The gate dielectric layer 116 provides for a dielectric material (i.e., a gate dielectric layer 116 and a gate dielectric protection layer 118) having a low thickness (e.g., less than 50 angstroms) below the gate structure 112a and for a thicker dielectric material outside of the gate structure 112a. The low thickness of dielectric material provides for good power consumption, read noise, and radio telegraph signals for the APS 100. The thicker dielectric provides for good dark current and white pixel number.

As shown in FIG. 1B, the gate dielectric protection layer 118 has a first thickness $t_1$ at a location that is under the sidewall spacers 128 of the transistor devices, 125a and 125b, and a second thickness $t_2$ at a location that is outside of the sidewall spacers 128 of the transistor devices, 125a and 125b. In some embodiments, the first thickness $t_1$ may have a range of between approximately 50 angstroms and approximately 250 angstroms. The difference between the first thickness $t_1$ and the second thickness $t_2$ (i.e., $t_1-t_2$) may be in a range of between approximately 10 angstroms and approximately 200 angstroms.

Figure 2:
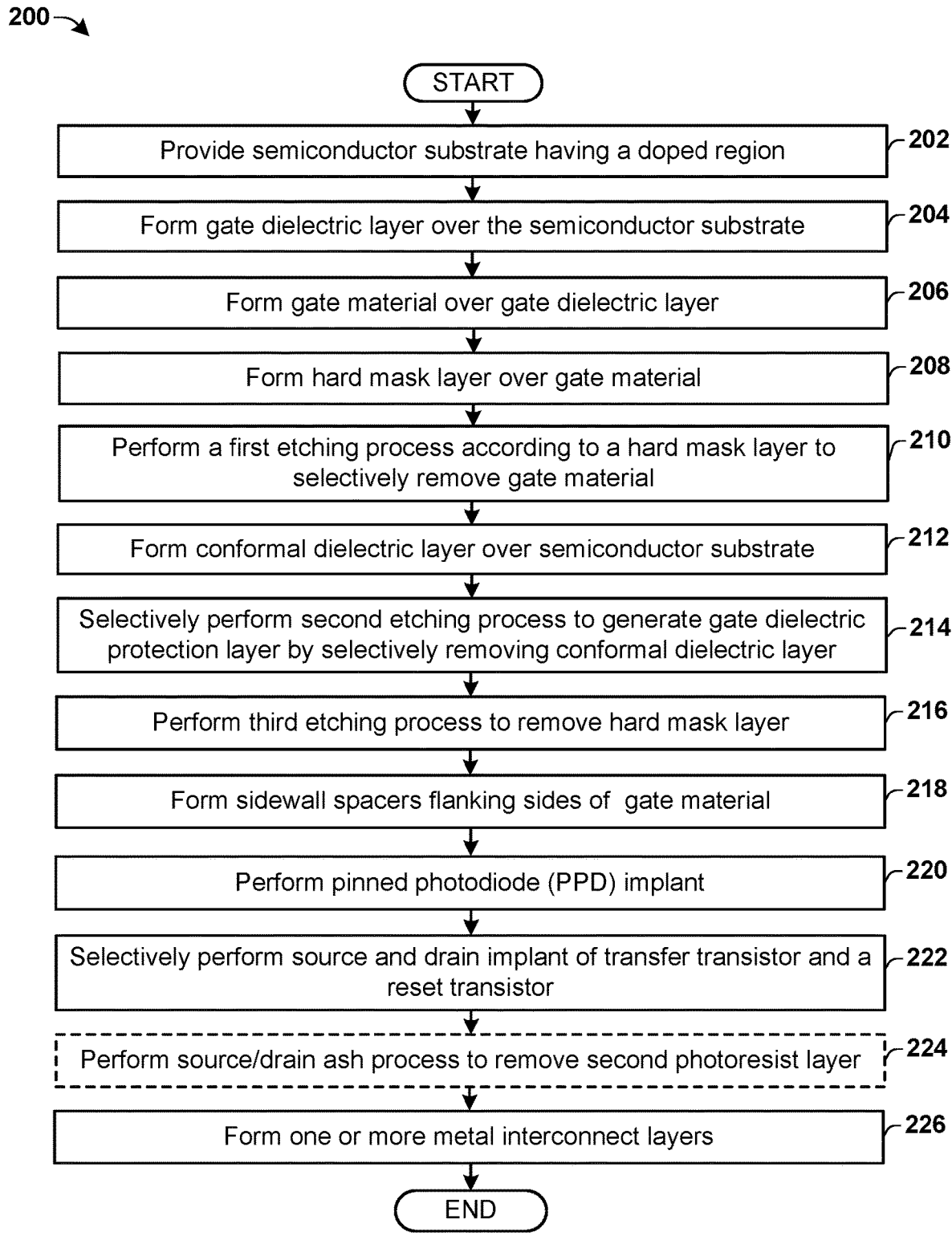
FIG. 2 illustrates a flow chart of some embodiments of a method of forming an active pixel sensor comprising a gate dielectric protection layer.

FIG. 2 illustrates a flow chart of some embodiments of a method 200 of forming an active pixel sensor comprising a photodiode gate dielectric protection layer.

While method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202, a semiconductor substrate having a doped region is provided. The semiconductor may comprise a first doping type (e.g., the p-type doping), while the doped region may comprise a second doping type (e.g., an n-type doping) different than the first doping type.

At 204, a gate dielectric layer is formed over the semiconductor substrate.

At 206, a gate material is formed over the gate dielectric layer.

At 208, a hard mask layer is selectively formed over the gate material. In various embodiments, the hard mask layer may comprise a silicon nitride layer or a silicon dioxide layer.

At 210, a first etching process is performed to selectively etch the gate material according to the hard mask layer. The first etching process results in a first region of gate material corresponding to a transfer transistor and a second region of gate material corresponding to a reset transistor.

At 212, a conformal dielectric layer is formed over the semiconductor substrate. The conformal dielectric layer overlies the gate dielectric layer, the first and second regions of gate material, and the hard mask layer.

At 214, a second etching process is performed to selectively etch the conformal dielectric layer. In some embodiments the second etching process may be performed to selectively etch the conformal dielectric layer according to a first photoresist layer. The first photoresist layer may be formed to cover a portion of the conformal dielectric layer. For example, the first photoresist layer may expose the conformal dielectric layer at positions corresponding to a top of the gate material. The second etching process generates a gate dielectric protection layer comprising a remainder of the conformal dielectric layer. In some embodiments, the gate dielectric protection layer overlies the gate dielectric layer and sidewalls of the gate material, but does not overlay a top of the gate material.

At 216, a third etching process is performed to remove the hard mask layer. The third etching process may reduce the thickness of the gate dielectric protection layer. It will be appreciated that since the third etching process exposes both the hard mask layer and the gate dielectric protection layer, that a material of the hard mask layer may be selected based upon a material of the gate dielectric protection layer. For example, if the gate dielectric protection layer comprises a $SiO_2$ layer, the hard mask layer may be selected to comprise a SiON material, while if the gate dielectric protection layer comprises a SiN layer, the hard mask layer may be selected to comprise a SiO$_2$ material.

At 218, sidewall spacers are formed flanking sides of the gate material.

At 220, a pinned photodiode implantation is performed to form a pinned photodiode within the semiconductor substrate.

At 222, a source and drain implantation is selectively performed to form source and drain regions of the transfer transistor and the reset transistor. In some embodiments, the source and drain implantation is performed according to a second photoresist layer.

At 224, the second photoresist layer may be removed by a source/drain ashing process. Removal of the second photoresist layer reduces the thickness of the gate dielectric protection layer to have a greater thickness underneath sidewall spacers of the transfer transistor and the reset transistor than outside of the sidewall spacers of the transfer transistor and the reset transistor.

At 226, one or more metal interconnect layers are formed above the transfer transistor and the reset transistor.

FIGS. 3-12 illustrate some embodiments of an exemplary semiconductor substrate, whereon a method of etching according to method 200 is implemented. Although FIGS. 3-12 are described in relation to method 200, it will be appreciated that the structures disclosed in FIGS. 3-12 are not limited to such a method.

FIG. 3 illustrates some embodiments of a cross-sectional view 300 of a substrate corresponding to acts 202-204.

The substrate comprises a semiconductor substrate 102 and an overlying gate dielectric layer 116a-116b. The semiconductor substrate 102 may comprise any type of semiconductor body (e.g., silicon, silicon-germanium, silicon-on-insulator) such as a semiconductor wafer and/or one or more die on a wafer, as well as any other type of semiconductor and/or epitaxial layers associated therewith. In some embodiments, the semiconductor substrate 102 comprises a first doping type (e.g., a p-type doping).

The gate dielectric layer 116a-116b is formed over the semiconductor substrate 102 between first and second isolation regions, 104a and 104b, located along outer edges of an active pixel sensor region 302 comprising a first doped region 108 having a second doping type (e.g., an n-type doping). The first gate dielectric has a thickness that is less than or equal to approximately 50 angstroms.

In some embodiments, the semiconductor substrate 102 may further comprise a periphery region 304 (i.e., an I/O region) spatially separated on an integrated chip from the active pixel sensor region 302. The periphery region 304 comprises one or more well regions 306 having the second doping type. The one or more well regions 306 are separated from one another by isolation regions 104c-104e (e.g., shall trench isolation regions). In some embodiments, the gate dielectric layer 116a-116b may be deposited through a dual gate dielectric process, in which the gate dielectric layer 116a-116b is formed to have a first gate dielectric layer 116a having a first thickness and a second gate dielectric layer 116b having a second thickness, different than the first thickness. The first gate dielectric layer 116a is disposed over the first doped region 108, the semiconductor substrate of the active pixel sensor region 302, and a well region of the periphery region 304 associated with 110 transistor devices. The second gate dielectric layer 116b is disposed over a well region of the periphery region 304 associated with core transistor devices.

FIG. 4 illustrates some embodiments of a cross-sectional view 400 of a substrate corresponding to acts 206-210.

As shown in cross-sectional view 400, a gate material 124 is selectively formed above the gate dielectric layer 116a-116b. The gate material 124 may be formed onto the semiconductor substrate 102 by way of a deposition technique (e.g., chemical vapor deposition, physical vapor deposition, etc.). In some embodiments, the gate material 124 may comprise polysilicon. In other embodiments, the gate material 124 may comprise a high-k metal gate material (e.g., aluminum, aluminum oxide, etc.).

In some embodiments, the gate material 124 may be deposited as a blanket deposition over the surface of the semiconductor substrate 102 and a hard mask layer 402 may be selectively formed over the gate material 124 to define gate structures. A first etching process is then performed to selectively etch the gate material 124 according to the hard mask layer 402. In some embodiments, the hard mask layer 402 may comprise silicon oxy-nitride (SiON) or silicon dioxide (SiO$_2$).

Figure 5:
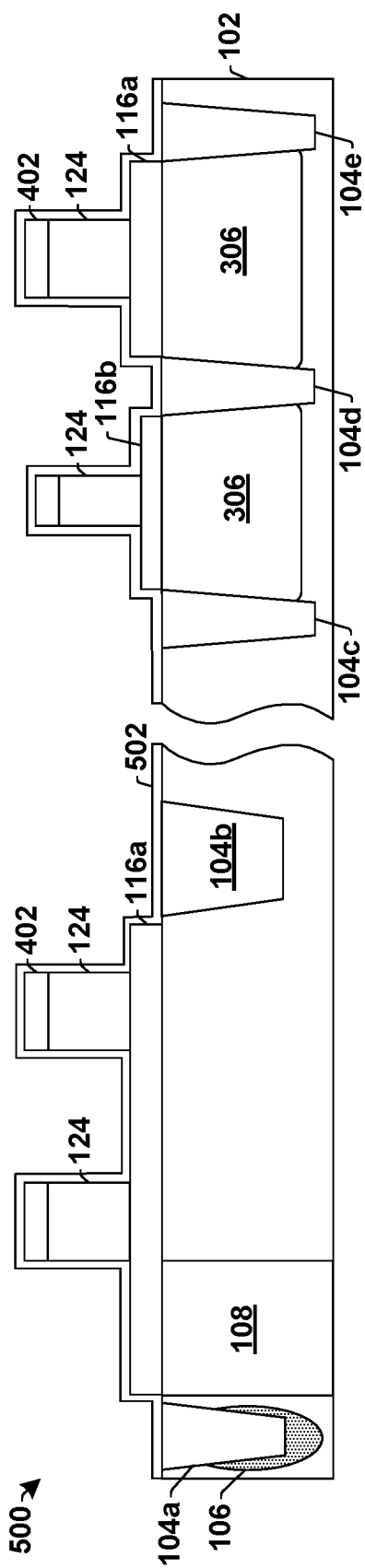

FIG. 5 illustrates some embodiments of a cross-sectional view 500 of a substrate corresponding to act 212.

As shown in cross-sectional view 500, a conformal dielectric layer 502 is formed onto the substrate. In some embodiments, the conformal dielectric layer 502 is formed to a thickness having a range of between approximately 30 angstroms and approximately 50 angstroms. In various embodiments, the conformal dielectric layer 502 may be formed using a thermal process or a deposition process (e.g., physical layer deposition, chemical vapor deposition, atomic layer deposition, etc.).

The conformal dielectric layer 502 is formed onto the semiconductor substrate at a position over the gate dielectric layer 116a-116b. In some embodiments, the conformal dielectric layer 502 is formed as a thin film that abuts isolation regions 104a-104b, the gate dielectric layer 116a-116b, the gate material 124, and the hard mask layer 402. In various embodiments, the conformal dielectric layer 502 may comprise an oxide layer, a silicon nitride layer, or a high-k dielectric material (e.g., hafnium oxide (HfO$_2$), aluminum oxide (Al$_2$O$_3$), titanium oxide (TiO$_2$), HfZrO, Ta$_2$O$_3$, HfSiO$_4$, ZrO$_2$, ZrSiO$_2$, etc).

In some embodiments, the hard mask layer 402 is selected to comprise a material based upon a material of the conformal dielectric layer 502. For example, if the conformal dielectric layer 502 comprises an oxide layer, the hard mask layer 402 may be selected to comprise a SiON material. If the conformal dielectric layer 502 comprises a SiN layer, the hard mask layer 402 may be selected to comprise a SiO$_2$ material. If the conformal dielectric layer 502 comprises a high-k dielectric material, the hard mask layer 402 may be selected to comprise a SiON material.

Figure 6:
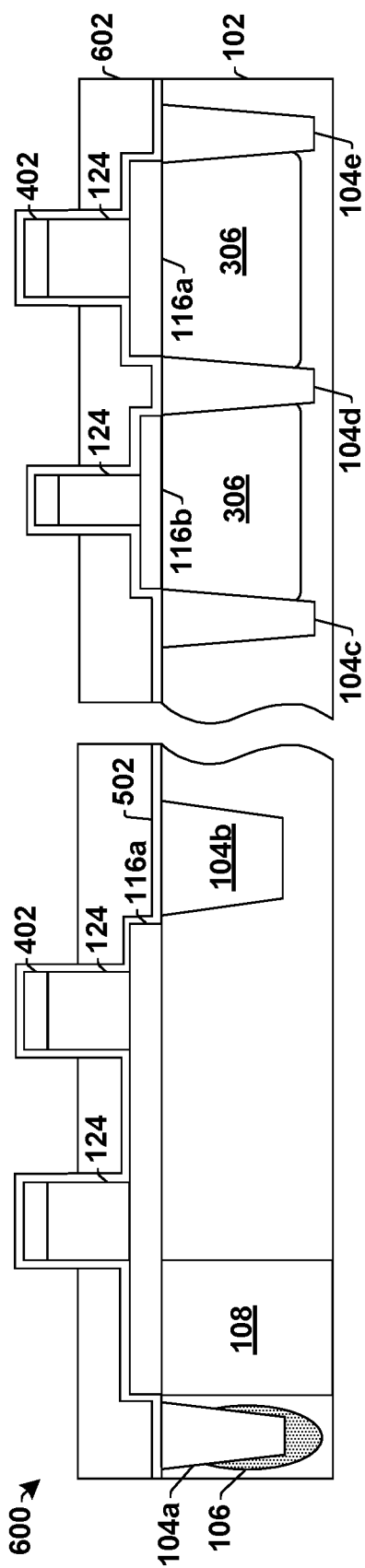

FIGS. 6-7 illustrate some embodiments of cross-sectional views, 600 and 700, of a substrate corresponding to act 214.

As shown in cross-sectional view 600, a first photoresist layer 602 is selectively formed over the semiconductor substrate 102. The first photoresist layer 602 is formed at a position that exposes a top portion of the gate material 124 and hard mask layer 402. In some embodiments, the first photoresist layer 602 may be formed by spinning photoresist onto the semiconductor substrate 102 as the semiconductor substrate 102 is rotated at a high rate of RPMs. The first photoresist layer 602 may subsequently be selectively exposed to form soluable sections overlying the gate material 124. The first photoresist layer 602 may then be developed, using a chemical developer to remove soluable sections from the semiconductor substrate 102.

As shown in cross-sectional view 700, a second etching process is performed by selectively exposing the semiconductor substrate 102 to an etchant 702 (e.g., a wet etchant or a dry etchant) that removes the conformal dielectric layer 502 from a top portion of the gate material 124 and the hard mask layer 402 to generate a gate dielectric protection layer 118 that overlies the gate dielectric layer 116a-116b. The gate dielectric protection layer 118 is configured to protect the underlying gate dielectric layer 116a-116b from subsequent etching processes. By protecting the gate dielectric layer 116a-116b from subsequent etching processes the gate dielectric layer 116a-116b can have a low thickness (e.g., less than 50 angstroms) below the gate material to provide for good power consumption, read noise, and radio telegraph signals of the APS, while providing for a thick dielectric outside of the gate material that provides for good dark current and white pixel number.

In some embodiments, after the second etching process is completed the gate dielectric protection layer 118 may extend along at least a lower portion of the gate material 124. For example, the gate dielectric protection layer 118 may be removed from the hard mask layer 402 and a portion of the underlying gate material 124.

FIG. 8 illustrates some embodiments of a cross-sectional view 800 of a substrate corresponding to act 216.

As shown in cross-sectional view 800, the hard mask layer 402 is removed from the semiconductor substrate 102. The hard mask layer 402 is removed by exposing the semiconductor substrate 102 to an etchant 802 that removes the hard mask layer 402. The etchant 802 also acts upon the gate dielectric protection layer 118, thereby consuming some of the gate dielectric protection layer 118.

FIG. 9 illustrates some embodiments of a cross-sectional view 900 of a substrate corresponding to acts 218-220.

As shown in cross-sectional view 900, a silicide layer 126 is formed onto the gate material 124. The silicide layer 126 may comprise a silicon-nitride (SiN) material. Sidewall spacers 128 are then formed to flank sides of the gate material 124 and the silicide layer 126. In some embodiments, the sidewall spacers 128 may be formed by depositing nitride onto the semiconductor substrate 102 and selectively etching the nitride to form the sidewall spacers 128. In some embodiments, a dielectric material 902, such as an oxide, may be positioned between the sidewall spacers 128 and the gate dielectric protection layer 118.

A photodiode implantation 904 is performed by implanting a dopant into the semiconductor substrate 102 in the first doped region 108 to form a photodetector 107 (e.g., a pinned photodiode). The photodiode implantation 904 forms a second doped region 110 within the first doped region 108 of the active pixel sensor region 302. The second doped region 110 may comprise a first doping type (e.g., a p-type doping) that is different than the second doping type of the first doped region 108. For example, in some embodiments, the photodiode implantation 904 may comprise a boron implantation.

FIG. 10 illustrates some embodiments of a cross-sectional view 1000 of a substrate corresponding to act 222.

As shown in cross-sectional view 1000, a second photoresist layer 1002 is selectively formed over the semiconductor substrate 102. The second photoresist layer 1002 comprises an opening that exposes the location of source and drain regions within the semiconductor substrate 102.

A source and drain implantation 1004 is performed to form the source and drain regions of semiconductor devices within the semiconductor substrate 102 according to the second photoresist layer 1002. The source and drain implantation 1004 forms a floating diffusion region 112 and a source/drain region 114 having a second doping type within the active pixel sensor region 302. The source and drain implantation 1004 may also forms source/drain regions 1006 within the periphery region 304.

The source and drain implantation 1004 results in the formation of a transfer transistor 125a and a reset transistor 125b within the active pixel sensor region 302. The source and drain implantation 1004 also results in the formation of a core transistor device 1008 and an I/O transistor 1010 within the periphery region. The transfer transistor 125a, the reset transistor 125b, and the I/O transistor 1010 have the first gate dielectric layer 116a comprising the first dielectric thickness, while the core transistor device 1008 has the second gate dielectric layer 116b comprising the second dielectric thickness.

FIG. 11 illustrates some embodiments of a cross-sectional view 1100 of a substrate corresponding to act 224.

As shown in cross-sectional view 1100, after the source and drain implantation 1004 is completed, the second photoresist layer 1002 is removed from the semiconductor substrate 102 using a source/drain ashing process. In some embodiments, the source/drain ashing process may comprise a dry etching process (e.g., using a $CF_4$ dry etch chemistry). The ashing process will remove the photoresist but in the process may also remove a portion of the gate dielectric protection layer 118, resulting in a gate dielectric protection layer 118 that has a first thickness $t_1$ underneath the sidewall spacers 128 of the transistor devices and a second thickness $t_2$ outside of the sidewall spacers 128 of the transistor devices. In some embodiments, the first thickness $t_1$ may have a range of between approximately 50 angstroms and approximately 250 angstroms, and the second thickness $t_2$ may have a range of between approximately 10 angstroms and approximately 200 angstroms.

FIG. 12 illustrates some embodiments of a cross-sectional view 1200 of a substrate corresponding to act 226.

As shown in cross-sectional view 1200, one or more metal interconnect layers 1204 are formed above the transistor devices, 125a and 125b. The one or more metal interconnect layers 1204 are disposed within an inter-level dielectric layer 1202 and connected to the transistor devices, 125a and 125b, by way of a contact 130. In some embodiments, the inter-level dielectric layer 1202 may comprise a low-k dielectric material (e.g., SiCO) or an ultra low-k dielectric material. In some embodiments, one or more metal interconnect layers 1204 may comprise copper.

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to an active pixel sensor having a gate dielectric protection layer configured to reduce damage to an underlying gate dielectric layer and/or semiconductor substrate during fabrication, and an associated method of formation.

In some embodiments, the present disclosure relates to an integrated chip. The integrated chip comprises a photodetector disposed within a substrate, and a gate structure located over the substrate. A gate dielectric protection layer is disposed over the substrate and extends from along a sidewall of the gate structure to a location overlying the photodetector. The gate dielectric protection layer has an upper surface that is vertically below an upper surface of the gate structure.

In other embodiments, the present disclosure relates to an integrated chip. The integrated chip comprises a gate structure disposed over a substrate, and a gate dielectric protection layer disposed over the substrate along a sidewall of the gate structure. A sidewall spacer arranged over the gate dielectric protection layer and surrounding the gate structure. The gate dielectric protection layer has a first thickness below the sidewall spacer and a second thickness outside of the sidewall spacer.

In other embodiments, the present disclosure relates to an integrated chip. The integrated chip comprises a gate structure disposed over a substrate, and a gate dielectric protection layer disposed over the substrate along a side of the gate structure. A sidewall spacer is arranged over the gate dielectric protection layer on a side of the gate structure. The gate dielectric protection layer extends from below the sidewall spacer to outside of the sidewall spacer.

What is claimed is:

1. A method of forming an integrated chip, comprising:
   forming a gate dielectric layer over a substrate having a first photodetector region;
   forming a gate material over the gate dielectric layer;
   forming a dielectric protection layer over the gate dielectric layer; and
   forming a first sidewall spacer along a first side of the gate material, wherein the dielectric protection layer extends from a first location directly over the first photodetector region to a top surface that is vertically below a top of the gate material and laterally between the first sidewall spacer and the gate material.

2. The method of claim 1, wherein the gate dielectric layer extends past the first side of the gate material.

3. The method of claim 1, wherein the dielectric protection layer is deposited over the gate material and subsequently etched back to below the top of the gate material.

4. The method of claim 1, further comprising:
   forming a masking layer over the substrate, wherein the dielectric protection layer has sidewalls that protrude outward from a top of the masking layer;
   etching the dielectric protection layer according to the masking layer; and
   removing the masking layer.

5. The method of claim 4, wherein the masking layer has an upper surface arranged along a horizontal plane that intersects sidewalls of the gate material.

6. The method of claim 4, further comprising:
   forming a hard mask onto a gate material layer over the substrate;
   selectively patterning the gate material layer according to the hard mask to define the gate material prior to forming the masking layer; and
   removing the hard mask after removing the masking layer.

7. The method of claim 4, further comprising:
   forming a second photodetector region over the first photodetector region after forming the dielectric protection layer, wherein the first photodetector region has a different doping type than the second photodetector region.

8. The method of claim 1, further comprising:
   forming a second masking layer over the first photodetector region;
   implanting the substrate to form a floating diffusion region on a second side of the gate material opposing the first side of the gate material; and
   removing the second masking layer, wherein removing the second masking layer reduces a thickness of the dielectric protection layer outside of the first sidewall spacer.

9. The method of claim 1, further comprising:
   forming an etch stop layer over the substrate, wherein the etch stop layer contacts a sidewall and an upper surface of the dielectric protection layer.

10. The method of claim 1, wherein the dielectric protection layer is formed by atomic layer deposition.

11. A method of forming an integrated chip, comprising:
    forming a gate dielectric layer over a substrate;
    forming a gate material over the gate dielectric layer;
    depositing a dielectric protection layer over the gate dielectric layer;
    forming sidewalls spacers along sides of the gate material and over a part of the dielectric protection layer; and
    reducing a thickness of the dielectric protection layer outside of the sidewall spacers to a non-zero thickness.

12. The method of claim 11, wherein the dielectric protection layer is formed by atomic layer deposition to an initial thickness in a range of between approximately 30 angstroms and approximately 50 angstroms.

13. The method of claim 11, wherein the gate dielectric layer is formed to a thickness that is less than approximately 50 angstroms.

14. The method of claim 11, wherein the dielectric protection layer comprises a first sidewall that protrudes outward from a first upper surface of the dielectric protection layer and a second sidewall that protrudes outward from a second upper surface of the dielectric protection layer.

15. The method of claim 11, wherein the sidewall spacers cover a topmost surface of the dielectric protection layer.

16. A method of forming an integrated chip, comprising:
    forming a gate dielectric layer over a substrate;
    forming a conductive gate electrode over the gate dielectric layer;
    depositing a dielectric protection layer over the conductive gate electrode;
    etching the dielectric protection layer according to a masking layer that has an upper surface below a top of the conductive gate electrode;

removing the masking layer; and forming a sidewall spacer along a first side of the conductive gate electrode after removing the masking layer.

17. The method of claim 16, wherein etching the dielectric protection layer removes the dielectric protection layer from above the upper surface of the masking layer.

18. The method of claim 16, wherein the gate dielectric layer has a substantially constant thickness between outermost sidewalls of the gate dielectric layer; and wherein the dielectric protection layer has a first region having a first thickness and a second region having a second thickness that is less than the first thickness, the first region laterally between the conductive gate electrode and the second region.

19. The method of claim 16, further comprising:

forming an isolation structure within the substrate, wherein an outermost sidewall of the gate dielectric layer is laterally between the conductive gate electrode and an outermost edge of the isolation structure; and wherein the dielectric protection layer extends over the isolation structure.

20. The method of claim 16, further comprising:

etching the dielectric protection layer in areas not covered by the sidewall spacer.

\* \* \* \* \*